(12) United States Patent
Jacobson et al.

(10) Patent No.: US 7,134,391 B2
(45) Date of Patent: Nov. 14, 2006

(54) APPARATUS AND METHOD FOR SIDE PRINTING ON LOW TEMPERATURE CO-FIRED CERAMIC (LTCC) SUBSTRATES

(75) Inventors: Rena Y. Jacobson, Ellicott City, MD (US); Tapan K. Gupta, Ellicott City, MD (US); Peter Cheung, Elkridge, MD (US); Theodore R. Vasilow, New Freedom, PA (US); Wayne A. Smythe, Pasadena, MD (US); James L. Wilkie, Baltimore, MD (US)

(73) Assignee: Northrop Grumman Corporation, Osaka (JP)

( * ) Notice: Subject to any disclaimer, the term of this patent is extended or adjusted under 35 U.S.C. 154(b) by 117 days.

(21) Appl. No.: 10/896,174

(22) Filed: Jul. 22, 2004

(65) Prior Publication Data

US 2006/0016353 A1 Jan. 26, 2006

(51) Int. Cl.
*B41F 15/18* (2006.01)
(52) U.S. Cl. ............... 101/129; 101/126; 101/407.1

(58) Field of Classification Search ............ None
See application file for complete search history.

(56) References Cited

U.S. PATENT DOCUMENTS 6,114,986 A  9/2000 Cassen et al. ............. 342/175
6,820,553 B1 * 11/2004 Steffen et al. ............. 101/474

FOREIGN PATENT DOCUMENTS

JP  06191009 A  *  7/1994
JP  07195659 A  *  8/1995

* cited by examiner

*Primary Examiner*—Daniel J. Colilla
(74) *Attorney, Agent, or Firm*—Birch, Stewart, Kolasch & Birch, LLP

(57) ABSTRACT

A fixture attached to the rear of the base plate of a semi-automatic screen printer includes an element holder having a vertical recess or pocket for receiving an assembly, such as a substrate, of LTCC laminate material lengthwise therein so as to expose only one side surface to the printing head which would otherwise be prevented because of the height restrictions imposed by the printer head.

17 Claims, 3 Drawing Sheets

APPARATUS AND METHOD FOR SIDE PRINTING ON LOW TEMPERATURE CO-FIRED CERAMIC (LTCC) SUBSTRATES

CROSS REFERENCE TO RELATED APPLICATION

This application is related to U.S. Ser. No. 10/718,805 (Northrop Grumman Case No. 000408-078) entitled "Fabrication of LTCC T/R Modules With Multiple Cavities And An Integrated Ceramic Ring Frame" filed on Nov. 24, 2003 in the name of Rena Y. Jacobson et al., and which is assigned to the assignee of the present invention and which is incorporated herein by reference.

BACKGROUND OF THE INVENTION

1. Field of the Invention

This invention relates generally to side printing on a laminated assembly of low temperature co-fired ceramic (LTCC) material, and more particularly to a method and apparatus for side printing on an LTCC substrate for microwave transmit/receive (T/R) modules which are used in connection with an active aperture of a phased array radar system.

2. Description of Related Art

The conventionally used screen printers cannot accommodate the newly designed LTCC substrates because of height restrictions associated with the screen printers and because of the currently used hold down mechanisms for the substrates.

Conventional T/R module packages include a structure utilizing a multi-cavity and a multi-layer substrate as shown, for example, in U.S. Pat. No. 6,114,986, comprised of high temperature co-fired ceramic (HTCC) layers including, for example, black alumina ceramics and tungsten. The ceramic layers have outer surfaces including metallization patterns of ground planes and conductors as well as feedthroughs or vertical vias formed therein for providing three dimensional routing of both RF and DC signals. Active circuit components comprised of integrated circuit chips are located in the various cavities of the substrate. The active circuit components are used for implementing suitable control and generating functions of RF signals to and from respective antenna elements. In addition, such HTCC designs utilize a nickel/gold plating approach.

However, a newly designed LTCC substrate such as shown and described in related application Ser. No. 10/718,805, does not accept the nickel/gold plating approach because such LTCC design, including T/R modules incorporating the same, include highly complex packages of up to 20 or more layers of tape and have multiple cavities with different floor thicknesses, through-holes, and an integrated ring frame in the package as required, for example, by an LTCC T/R module utilized in a radar system.

The newly designed LTCC T/R module referred to above utilizing such a complex package design requires that RF lines extend to the outer surface (periphery) of the LTCC substrate. The RF lines are then connected to connector pins through a brazing operation. In order for a print to be added to the RF lines, metallization must be deposited and fired on the outer side wall of the LTCC substrate. Side printing requires deposition of brazeable metallization; however, LTCC material does not accept the standard HTCC approach of using nickel/gold plating. Furthermore, attempts have been made to use standard screen printers to do side printing, however, the standard screen printers cannot accommodate a part standing on its end or a part having a thickness greater than 1". As such, in using standard screen printers, there is no room for the part to stand nor is there any currently available method of hold down for parts thicker than 1". Therefore, in order for the side of the LTCC substrate to be printed on, a new and improved print fixture is needed and comprises the subject matter of this invention.

SUMMARY OF THE INVENTION

Accordingly, it is an object of the present invention to provide an apparatus for performing the difficult task of side printing a LTCC substrate for a T/R module design using a standard MPM screen printer.

It is another object of the present invention to provide an improved print fixture, e.g., a workholder, for accommodating an LTCC substrate, wherein the improved workholder is capable of being used within standard screen printers.

These and other objects are achieved in the present invention by an improved apparatus and method for side printing the newly designed LTCC substrates, for a T/R module, by the addition of a modified workholder to, for example, an MPM SP-1500 Semi-Automatic Screen Printer.

Such a modified workholder takes advantage of the free space at the back of the standard workholder base in an MPM SP-1500 Semi-Automatic Screen Printer. As a result, the 2" height of the newly designed LTCC T/R module can be placed in the depth of this free space, allowing the top of the substrate to sit flush with a printing surface of the printer. This arrangement allows easy clearance of the height restrictions imposed by the printer head. In other words, the present invention allows an add-on fixture/workholder, having a recess or a pocket for the LTCC substrate to sit in, to be added to the base plate of an existing screen printer.

As a result, side printing capabilities, relating to brazeable metallization, are achieved by the present invention wherein connector pins are attached thereto. In general, brazing metallization is also used to attach heat sinks and covers or lids. A result of the present invention, an LTCC substrate for a T/R module is provided which is relatively simple, elegant and light in weight.

In forming a newly designed LTCC substrate, such as shown in related application Ser. No. 10/718,805, typically a number of LTCC tape layers are initially divided into multiple stacks of tape layers, e.g., four stacks or sections, based on a final cavity routing configuration of each stack. One of the stacks preferably comprises a set of layers for the formation of a ceramic ring frame. Each stack is then separately tack laminated, followed by cavity patterns being machined therein using a router device whereby a large number of layers are routed in a single pass, forming cavities having side walls which are relatively smooth and straight as opposed to the known prior art method of cutting individual layers with a laser, for example, which results in the formation of jagged side walls. Following cavity routing, all of the stacks are laid up on a base plate including a set of tooling pins for providing alignment of the stacks. The lay up is completed with a placement of a top mylar template followed by a copper template. The assembly is next covered with an expandable latex sheet that has been lightly coated with a graphite aerosol for aiding the removal of the latex sheet without metal lift-off after lamination. The assembly is then placed in a lamination fixture and isostatically laminated for a specific period of time at a predetermined pressure and temperature, typically 4000–5000 psi at 72° C. for 15 minutes, resulting in a structure in the form of laminated panel. The panel is then allowed to cool, removed from the fixture where it is green cut to remove tooling holes and then fired with a designated firing profile. A plurality of mutually identical newly designed LTCC substrates for a T/R module are then diced, i.e. cut, from the panel and post fire printed as required.

Due to the design of conventional screen printers, e.g., the MPM SP-1500 printer, for example, the printing of LTCC substrates incorporating the above noted design was limited to a certain range of the overall thickness of the substrate or board. For instance, the allowable thickness of the substrates were limited to less than 1" maximum. Substrates with a thickness greater than 1" were not able to access the print position inside of the standard screen printing machine due to the fact that the printer head was in the way. However, the newly designed LTCC substrate for the T/R module is approximately 2" in height. As a result, the present invention is directed to a fixture or workholder that can accommodate the newly designed LTCC 2" substrate for side printing.

Further scope of applicability of the present invention will become apparent from the detailed description provided hereinafter. It should be noted, however, that the detailed description and specific examples, while indicating the preferred method of the invention, are provided by way of illustrations only, since various changes, alterations and modifications coming within the spirit and scope of the invention will become apparent to those skilled in the art from the following detailed description.

BRIEF DESCRIPTION OF THE DRAWINGS

The present invention will become more fully understood when considered in conjunction with the accompanying drawings, which are provided by way of illustration and thus are not meant to be considered in a limiting sense, and wherein.

DETAILED DESCRIPTION OF THE INVENTION

The subject invention is directed to side printing on LTCC substrates of transmit/receive (T/R) modules utilized in connection with the phased array radar system.

Figure 1:
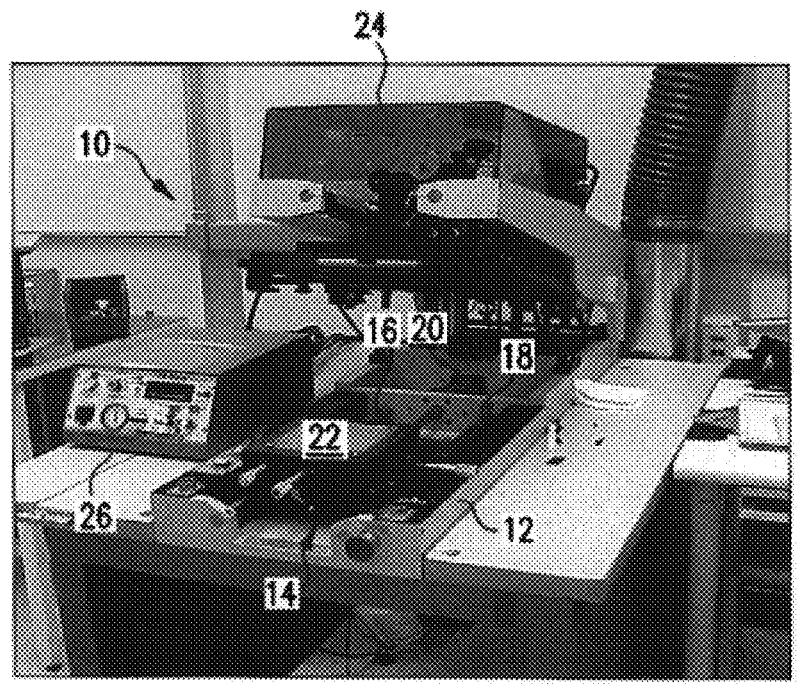
FIG. 1 is a front elevational view of a standard MPM SP-1500 printer.

Referring now to the drawings, and more particularly to FIG. 1, shown thereat is a conventional MPM SP-1500 printer semi-automatic screen printer 10 which includes, among other things, a generally rectangular bed 12, a workholder base plate 14 which is mounted on rails 16 and 18 and is moved forwardly and rearwardly by a motor 20. The base plate 14 shown in FIG. 1 is fitted with a porous vacuum plate 22 which is moved under a print head assembly 24 when lowered. Reference numeral 26 denotes a control console for the printer.

Figure 2:
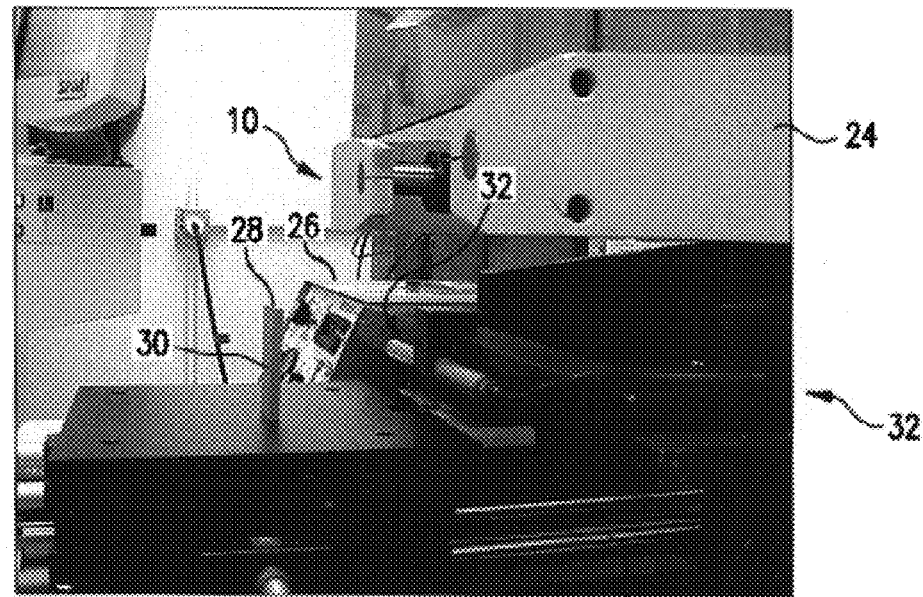
FIG. 2 illustrates how a top edge of a 2" substrate for a T/R module when stood on its end for side printing does not clear the printer head of the MPM SP-1500 printer shown in FIG. 1.

In a desire to use the printer 10 for printing on one side edge located at one end of a substrate 30 such as shown, for example, in related application Ser. No. 10/718,805 referenced above, FIG. 2 discloses that the height of the substrate 30 when stood on its end, does not clear the bottom surface of the printer head 32.

Figure 3:
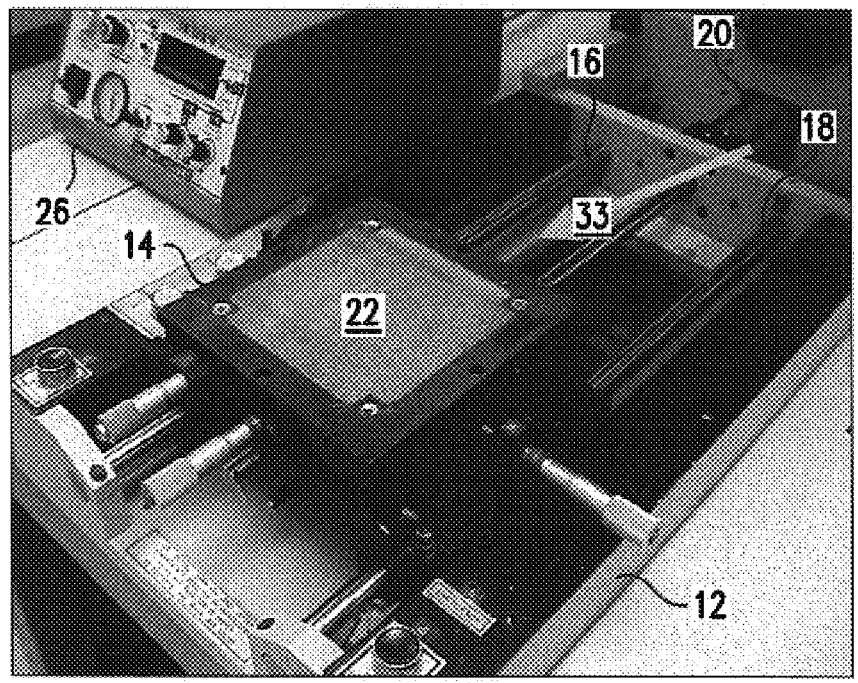
FIG. 3 is illustrative of a space behind the base plate of the printer shown in FIG. 1 for accommodating a fixture for holding the substrate shown in FIG. 2 in accordance with the present invention.
Figure 4:
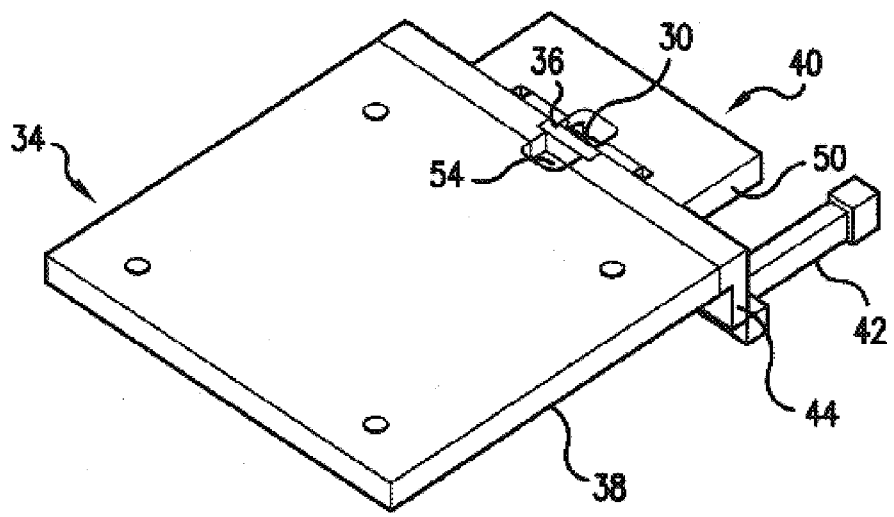
FIG. 4 is a perspective view of the preferred embodiment of the fixture for holding the substrate in accordance with the subject invention.
Figure 5:
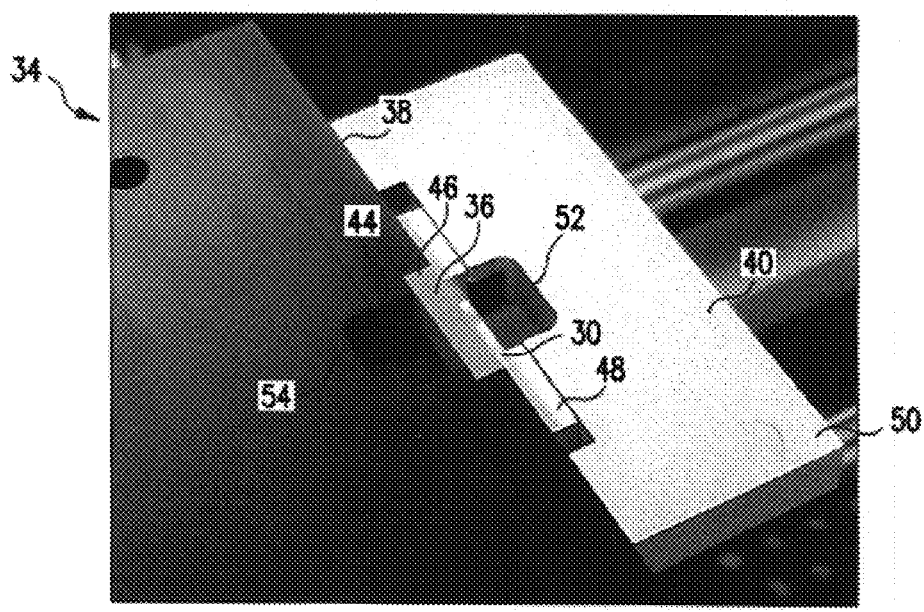
FIG. 5 illustrate the substrate positioned in the fixture shown in FIG. 4.

In an effort to overcome the height problem of the substrate 30 in relation to the printer head 32, a region 33 behind the base plate 14, shown in FIG. 3, was noted to provide a free space for accommodating a fixture 34, such as shown in FIG. 4, for holding the substrate 30 in a general vertical position while exposing the surface 36 of the side edge 28 because due to the design of the SP-1500 printer, the printing of substrates is limited to a certain range of overall thicknesses and/or length of the substrate or board. Allowable thicknesses of substrates is limited to less than 1" maximum. Substrates with thicknesses greater than 1" were not able to exit the print position inside the machine for printing due to the print head being in the way. Thus a substrate for a T/R module with its desired side for gold printing in the proper printing position is approximately 2" inches in height will not clear the print entrance. As a result, the workholder base plate had to be modified or a new workholder made. This resulted in the development of the fixture 34 for holding the substrate 30 in a vertical position as shown in FIG. 4.

The fixture 34 is comprises a structure having three main parts: a mounting plate 38, a substrate holder 40 and a switch extension piece 42. The mounting plate 38 is dimensioned so as to substantially match a top surface of the base plate 14 and attachable thereto so that the entire assembly can be moved as a unit in and out from under print head 24 for a printing operation on the surface 36 of the substrate 30.

Attached to the rear end of the mounting plate 34 is the substrate holder 40 which includes an elongated transverse L-shaped bar type element 44, as shown in FIG. 4, having a rectangular recess or pocket 46 for vertically receiving a substrate 30 therein so that only the surface 36 is flush with the surface of the mounting plate 38. The substrate 30, when inserted into the pocket 46, is held into place by a spring loaded block 48 and a rear plate member 50. This arrangement allows the substrate 30 to be held firmly in place for accurate printing. Both the mounting plate 38, the element 44, and the rear plate member 50 include generally rectangular cut-out regions 52 and 54 for enabling manual insertion and removal of the substrate 30 from the pocket 46.

The third part of the fixture 34 shown in FIG. 4 is the switch extension piece 42 which is shown attached to an outer end portion of an L-shaped bar element 44 of the substrate holder 40. This part is crucial for contacting a pressure switch (not shown) at the back of the printer. The pressure switch, when depressed, stops the motor 20 and thus the rearward movement of the base plate 14 and the attached fixture 34. The length of the extension determines the general position where the surface 36 of the substrate 30 will stop with respect to the printer head 24. Without the extension 42, the pressure switch would be depressed too late, and the substrate would be pushed all the way to the back of the printing machine, where printing would be impossible.

It should be noted, however, that in an alternate modification, not shown, the switch extension piece 42 can be attached to the base plate 14 shown in FIG. 3. Such an arrangement offers the advantage of holding the base plate 14 in place while allowing the substrate 30 to be maneuvered into a proper print position.

Thus what has been shown and described is a side print fixture which provides a relatively inexpensive method of side printing on LTCC substrates with a conventional MPM screen printer including substrates for T/R modules which include pin and shroud connections on the front side edge.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims

The invention claimed is:

1. A fixture located on printing apparatus for enabling side printing on an assembly of laminate material and including at least one side edge having a surface requiring a metallization pattern to be formed thereon, comprising:
   printing apparatus including a holder of an assembly of laminate material located adjacent one side portion of a base plate, having top, bottom and side portions, and a base plate which moves an object under a printing head during a printing operation; and
   a mounting plate attachable to the base plate and including a holder of said assembly of laminate material secured to a rear end of the mounting plate and having a pocket therein for receiving and holding said assembly of laminate material such that a surface of a side edge thereof faces the printing head during a printing operation.

2. The fixture according to claim 1 and additionally including a switch extension piece for stopping rearward movement of the base plate and holder for a printing operation on the surface of the side edge of said assembly.

3. The fixture according to claim 2 wherein the switch extension piece is secured to said holder.

4. The fixture according to claim 1 wherein the mounting plate comprises a flat plate dimensioned to substantially match a top surface of the base plate of the printing apparatus.

5. The fixture according to claim 4 wherein the surface of said side edge is substantially flush relative to a top surface of said mounting plate.

6. The fixture according to claim 1 wherein the holder of said assembly of laminate material includes a right angled bar member secured to the rear end of the mounting plate and wherein said pocket is located in said bar member.

7. The fixture according to claim 6 wherein said holder includes support means for holding the assembly of laminate material firmly in place in the pocket.

8. The fixture according to claim 7 wherein the support means includes a spring loaded support block in contact with the assembly of laminate material and a rear plate extending outwardly from the support block.

9. The fixture according to claim 8 wherein the mounting plate and rear plate include mutually aligned cut-out regions for the insertion and removal of said assembly from the pocket.

10. The fixture according to claim 1 wherein said assembly of laminate material is comprised of laminated layers of low temperature co-fired ceramic (LTCC) material.

11. The fixture according to claim 1 wherein said assembly of laminate material comprises an LTCC substrate.

12. The fixture according to claim 1 wherein said assembly of laminate material comprises an LTCC substrate for a T/R module for a radar system.

13. A fixture located on printing apparatus for enabling side printing on an assembly of LTCC laminate material and including at least one side edge having a surface requiring a metallization pattern to be formed thereon, comprising:
   a holder for said assembly of LTCC laminate material located adjacent a base plate of the printing apparatus which moves an object under a printing head during a printing operation and including a pocket therein for receiving and holding said assembly such that a surface of the side edge faces the printing head;
   a mounting plate attachable to the base plate of the printing apparatus and wherein said holder is secured to a rear end of the mounting plate;
   and a switch extension piece secured to said holder or the base plate for stopping rearward movement of the base plate and said holder for a printing operation on the surface of the side edge of said assembly of LTCC laminate material.

14. The fixture according to claim 13 wherein the surface of said side edge is substantially flush relative to a top surface of said mounting plate.

15. The fixture according to claim 13 wherein said holder of said assembly of LTCC laminate material includes support means for holding said assembly firmly in place in the pocket.

16. The fixture according to claim 13 wherein said assembly of LTCC laminate material comprises a substrate for a transmit/receive module for an active aperture of a radar system.

17. A method of printing metallization on a side surface of an LTCC substrate, comprising the steps of:
   locating a substrate holder including a pocket for the substrate on the base plate assembly of screen printing apparatus;
   locating the substrate in the pocket of the substrate holder so that only one side surface of the substrate faces a print head of the screen printing apparatus; and
   moving the substrate holder into a proper print position under the print head;
   printing a pattern of metallization on the one side surface of the substrate; and,
   removing the substrate from the substrate holder.

* * * * *